(12) United States Patent
Nagano et al.

(10) Patent No.: US 6,448,598 B2
(45) Date of Patent: *Sep. 10, 2002

(54) SEMICONDUCTOR MEMORY

(75) Inventors: Yoshihisa Nagano; Shinichiro Hayashi, both of Osaka; Yasuhiro Uemoto, Shiga, all of (JP)

(73) Assignee: Matsushita Electronics Corporation, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/338,542

(22) Filed: Jun. 23, 1999

(30) Foreign Application Priority Data

Jun. 24, 1998 (JP) .............................. 10-176877

(51) Int. Cl.⁷ .............................. H01L 27/108
(52) U.S. Cl. ................ 257/296; 257/296; 257/300; 257/301; 257/310; 438/238; 438/239; 438/386; 438/399
(58) Field of Search ................ 257/296, 300, 257/301, 310

(56) References Cited

U.S. PATENT DOCUMENTS

| | | | | |
|---|---|---|---|---|
| 5,486,713 A | * | 1/1996 | Koyama | 257/310 |
| 5,559,666 A | * | 9/1996 | Figura et al. | 361/321.4 |
| 5,568,352 A | * | 10/1996 | Hwang | 361/321.4 |
| 5,864,153 A | * | 1/1999 | Nagel et al. | 257/296 |
| 5,923,062 A | * | 7/1999 | Ohno | 257/298 |
| 5,932,906 A | * | 8/1999 | Shimizu | 257/306 |
| 6,198,122 B1 | * | 3/2001 | Habu et al. | 257/296 |

* cited by examiner

Primary Examiner—Jerome Jackson, Jr.
Assistant Examiner—Edgardo Ortiz
(74) Attorney, Agent, or Firm—Nixon Peabody LLP; Donald R. Studebaker (57) ABSTRACT

A semiconductor memory includes plural lower electrodes formed on a semiconductor substrate; a capacitor dielectric film of an insulating metal oxide continuously formed over the plural lower electrodes; plural upper electrodes formed on the capacitor dielectric film in positions respectively corresponding to the plural lower electrodes; and plural transistors formed on the semiconductor substrate. The plural lower electrodes are respectively connected with source regions of the plural transistors.

6 Claims, 6 Drawing Sheets

SEMICONDUCTOR MEMORY

BACKGROUND OF THE INVENTION

The present invention relates to a semiconductor memory using an insulating metal oxide as a capacitor dielectric film.

A conventional semiconductor memory will now be described with reference to FIG. 6.

Figure 6:
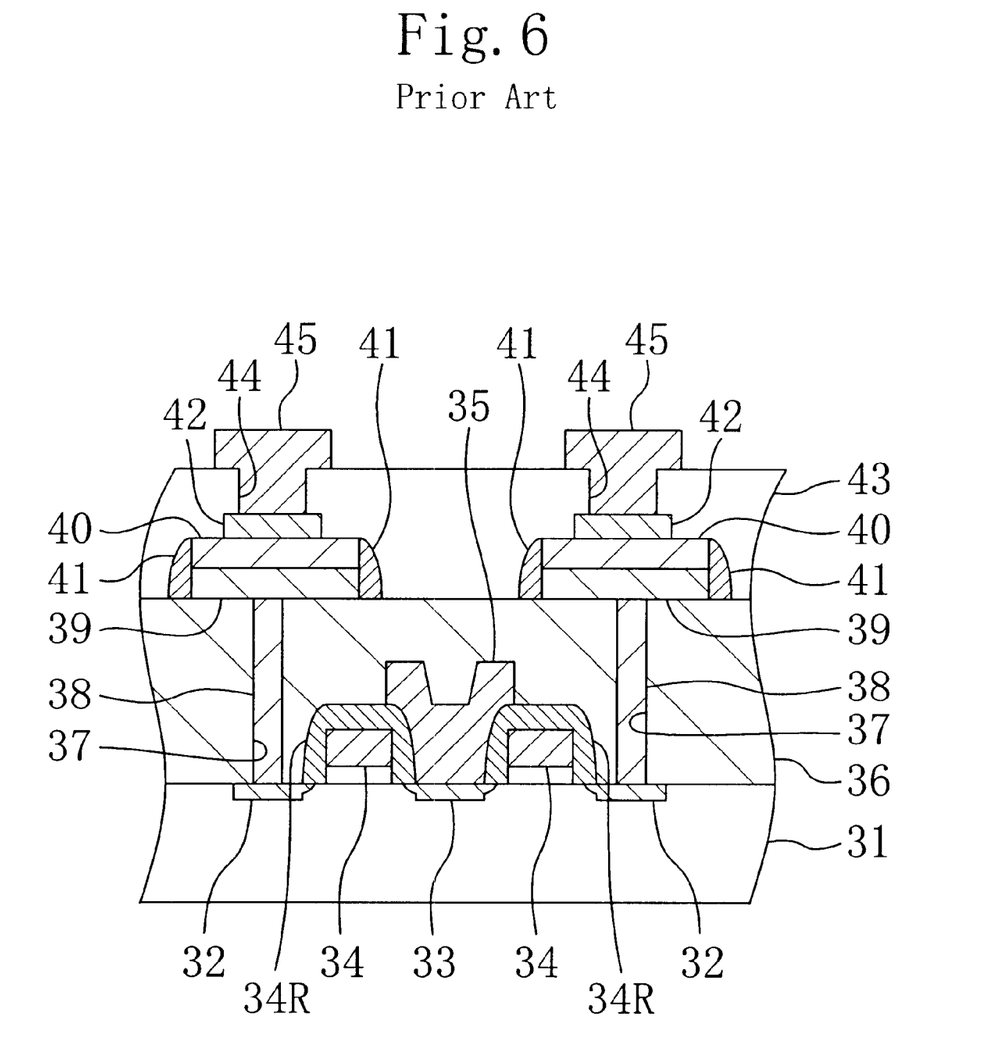
FIG. 6 is a sectional view of a part of a conventional semiconductor memory.

As shown in FIG. 6, a source region 32, a drain region 33 and a gate portion of a transfer gate having a function as a transistor of a memory cell are formed on a silicon substrate 31, and the gate portion includes a gate electrode 34 serving as a word line and an insulating film 34R covering the gate electrode 34. The drain region 33 is connected with a bit line 35.

Transistors each including the source region 32, the drain region 33, the gate electrode 34 and the like are disposed on the silicon substrate 31 in the form of an array so as to constitute a memory cell array, but the memory cell array is omitted in FIG. 6.

On the transistor, a first insulating layer 36 is formed, and the top surface of the first insulating layer 36 is flattened. In the first insulating layer 36, a contact hole 37 connected with the source region 32 is formed, and a conductive plug 38 is buried in the contact hole 37.

On the plug 38, a lower electrode 39 and a capacitive insulting film 40 of an insulating metal oxide processed by dry etching are formed, and on the side surfaces of the lower electrode 39 and the capacitor dielectric film 40, side walls 41 are formed. On the capacitor dielectric film 40, an upper electrode 42 is formed. The lower electrode 39, the capacitor dielectric film 40 and the upper electrode 42 together form a capacitor.

A second insulating layer 43 is formed so as to cover the capacitor. In the second insulating layer 43, a contact hole 44 reaching the upper electrode 42 is formed, and in the contact hole 44, a conductive metal wire 45 is formed.

In this conventional semiconductor memory, in forming the capacitor dielectric film 40 through the dry etching, strain derived from ion collision is caused in the crystal structure of the processed area of the capacitor dielectric film 40. As the capacitor has a finer structure, this strain more harmfully affects the electrical characteristic. As a result, the breakdown voltage of the capacitor is lowered.

SUMMARY OF THE INVENTION

An object of the invention is providing a semiconductor memory including a capacitor with a high breakdown voltage and fabricated without conducting dry etching on a capacitor dielectric film.

In order to achieve the object, the first semiconductor memory of this invention comprises plural lower electrodes formed on a semiconductor substrate; a capacitor dielectric film of an insulating metal oxide continuously formed over the plural lower electrodes; plural upper electrodes formed on the capacitor dielectric film in, positions respectively corresponding to the plural lower electrodes; and plural transistors formed on the semiconductor substrate, wherein the plural lower electrodes are respectively connected with source regions of the plural transistors.

The second semiconductor memory of this invention comprises plural lower electrodes formed on a semiconductor substrate; a capacitor dielectric film of an insulating metal oxide continuously formed over the plural lower electrodes; an upper electrode formed over the capacitor dielectric film; and plural transistors formed on the semiconductor substrate, wherein the plural lower electrodes are respectively connected with source regions of the plural transistors.

In the first or second semiconductor memory, the capacitor dielectric film is formed continuously over the plural lower electrodes, and hence, there is no need to conduct dry etching for patterning the capacitor dielectric film. Accordingly, strain can be prevented from being caused in the crystal structure over the entire capacitor dielectric film, resulting in improving the breakdown voltage of the capacitor.

In the first or second semiconductor memory, an outer edge of the capacitor dielectric film is preferably positioned in an outside portion away, by 1 $\mu$m or more, from an outer edge of an outermost lower electrode among the plural lower electrodes.

In the first or second semiconductor memory, each of the upper electrodes is preferably made from a platinum film or a laminating film including a platinum film and an iridium oxide film.

In the first or second semiconductor memory, the capacitor dielectric film is preferably made of a bismuth layer shaped perovskite ferroelectric, strontium barium titanate or tantalum pentaoxide.

DETAILED DESCRIPTION OF THE INVENTION

Embodiment 1

A semiconductor memory according to Embodiment 1 of the invention will now be described with reference to FIG. 1.

Figure 1:
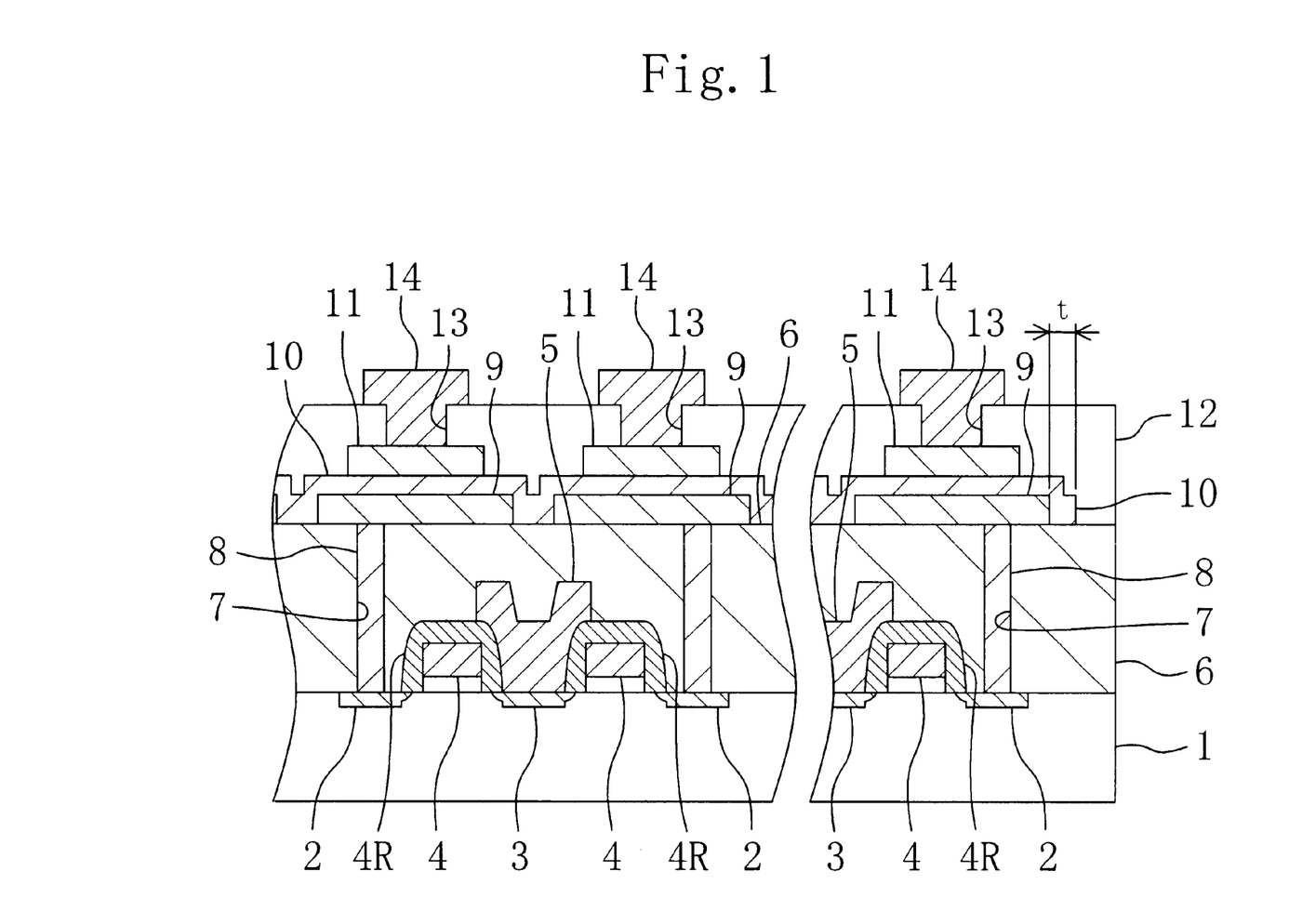
FIG. 1 is a sectional view of a main part of a semiconductor memory according to Embodiment 1 of the invention.

As shown in FIG. 1, a source region 2, a drain region 3 and a gate portion of a transfer gate having a function as a transistor of a memory cell are formed on a silicon substrate 1, and the gate portion includes a gate electrode 4 serving as a word line and an insulating film 4R covering the gate electrode 4. The drain region 3 is connected with a bit line 5.

Transistors each including the source region 2, the drain region 3, the gate electrode 4 and the like are disposed on the silicon substrate 1 in the form of an array so as to constitute a memory cell array, but the memory cell array is omitted in FIG. 1.

On the transistor, a first insulating layer 6 is formed, and the top surface of the first insulating layer 6 is flattened. In the first insulating layer 6, a contact hole 7 connected with the source region 2 is formed, and a conductive plug 8 is buried in the contact hole 7.

On the plugs 8 of the transistors, plural lower electrodes 9 are respectively formed, and on the plural lower electrodes 9, a capacitor dielectric film 10 of an insulating metal oxide is continuously formed. Upper electrodes 11 are formed on the capacitor dielectric film 10 in positions respectively corresponding to the lower electrodes 9. The lower electrode 9, the capacitor dielectric film 10 and the upper electrode 11 together form a capacitor.

A second insulating layer 12 is formed so as to cover the capacitor. In the second insulating layer 12, a contact hole 13 reaching the upper electrode 11 is formed, and a conductive metal wire 14 is formed in the contact hole 13.

In the semiconductor memory of this embodiment, since the capacitor dielectric film 10 is continuously formed over the plural lower electrodes 9, there is no need to conduct dry etching in order to pattern the capacitor dielectric film 10 into the shape corresponding to each lower electrode 9. Accordingly, strain derived from ion collision can be prevented from being caused in the crystal structure over the entire capacitor dielectric film 10, resulting in improving the breakdown voltage of the capacitor.

In Embodiment 1, when the upper electrode 11 is made from a platinum film or a laminating film including a platinum film and an iridium oxide film, the resultant capacitor can attain a better characteristic.

While the breakdown voltage of the capacitor is 15 V in the conventional semiconductor memory, capacitors excluding those disposed in the outermost portion in the semiconductor memory of Embodiment 1 attain an improved breakdown voltage of 35 V.

Figure 2:
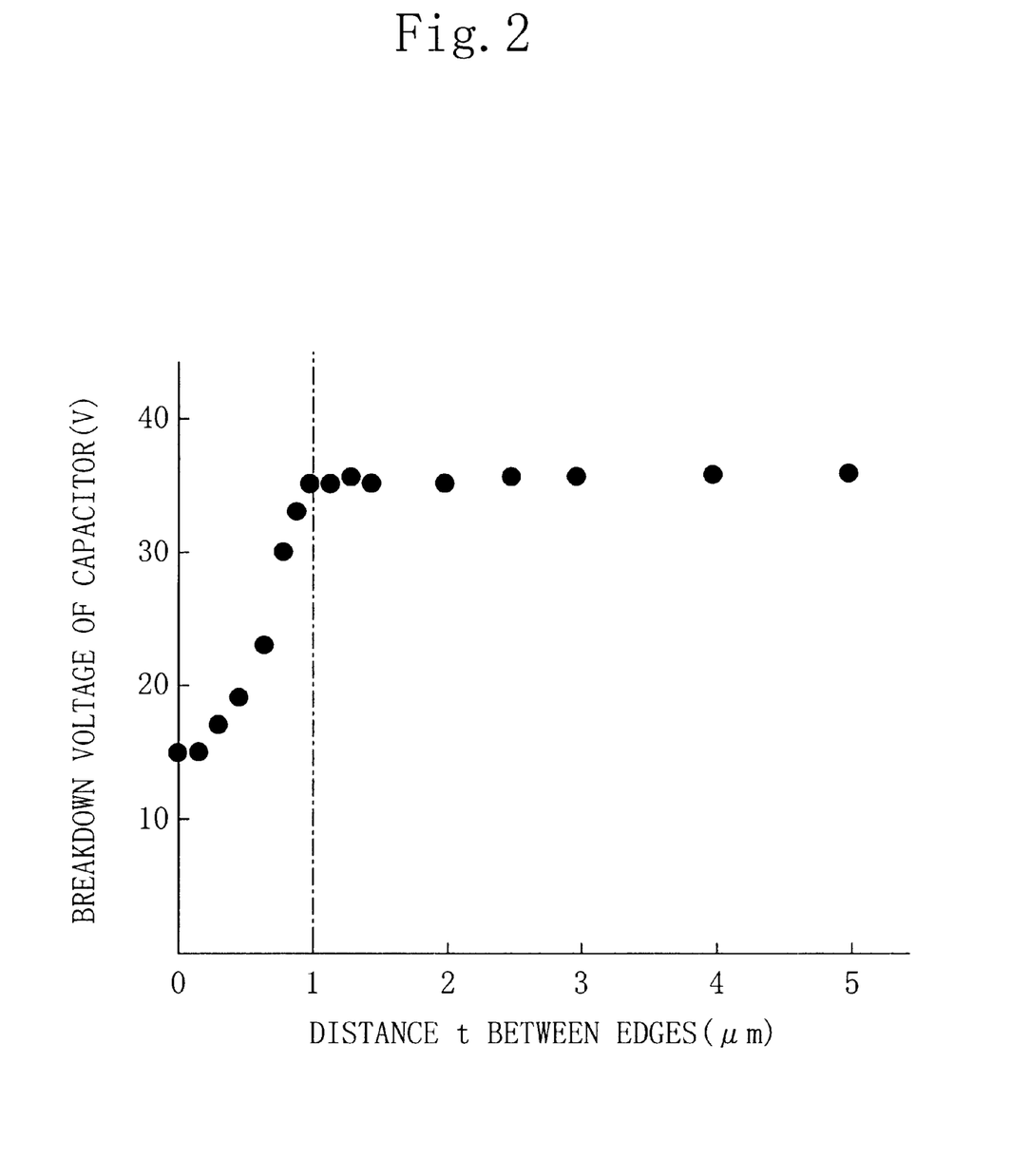
FIG. 2 is a characteristic diagram for showing the relationship between a breakdown voltage of a capacitor disposed in the outermost portion in the semiconductor memory of Embodiment 1 and a distance t between the edge of a lower electrode and the edge of a capacitor insulating film in this capacitor.

FIG. 2 shows the relationship between the breakdown voltage of a capacitor disposed in the outermost portion and a distance t (see FIG. 1) between the edge of the lower electrode 9 and the edge of the capacitor dielectric film 10 in this capacitor. As is understood from FIG. 2, when the distance t is 1 μm or more, the capacitor disposed in the outermost portion can attain a breakdown voltage of 35 V similarly to the other capacitors.

In fabricating a nonvolatile semiconductor memory, the insulating metal oxide included in the capacitor dielectric film 10 is preferably a bismuth layer shaped perovskite ferroelectric. The bismuth layer shaped perovskite ferroelectric is excellent in charge retention performance and polarization inversion characteristic.

Alternatively, in fabricating a volatile semiconductor memory, the insulating metal oxide included in the capacitor dielectric film 10 is preferably strontium barium titanate or tantalum pentaoxide. Strontium barium titanate and tantalum pentaoxide have a dielectric constant of 400 and 25, respectively, which are much larger than that of an insulating film of silicon nitride or silicon oxide. Accordingly, a dynamic RAM in the Gbit class can be easily realized by using these materials.

Modification of Embodiment 1

Figure 3:
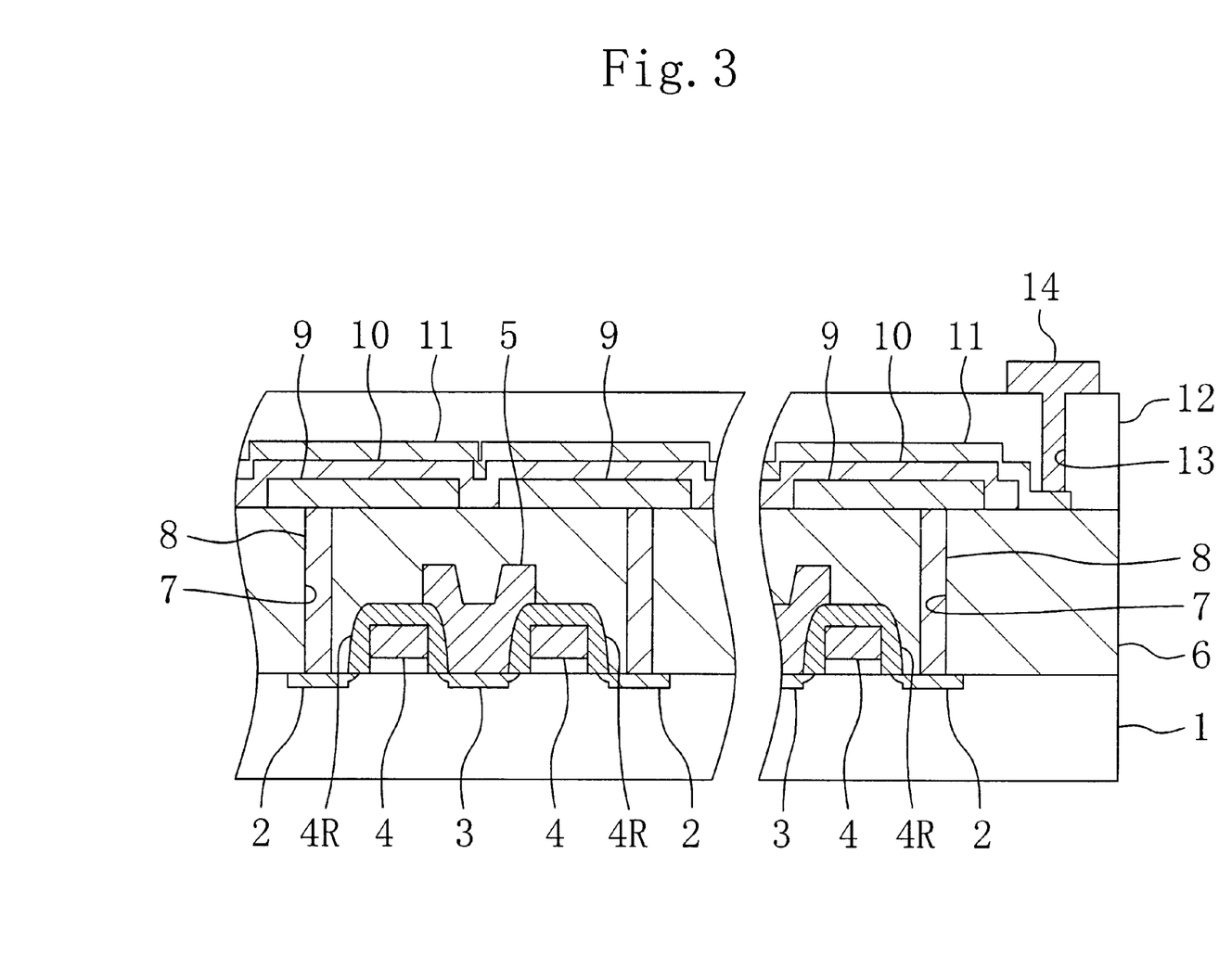
FIG. 3 is a sectional view of a main part of a semiconductor memory according to a modification of Embodiment

A semiconductor memory according to a modification of Embodiment 1 will now be described with reference to FIG. 3. In the modification of FIG. 3, like reference numerals are used to refer to like elements shown in FIG. 1, and the description is omitted.

As a characteristic of the semiconductor memory according to the modification of Embodiment 1, as is shown in FIG. 3, an upper electrode 11 is formed over an entire capacitor dielectric film 10, and one contact hole 13 and one metal wire 14 are formed.

Embodiment 2

A semiconductor memory according to Embodiment 2 of the invention will now be described with reference to FIG. 4.

Figure 4:
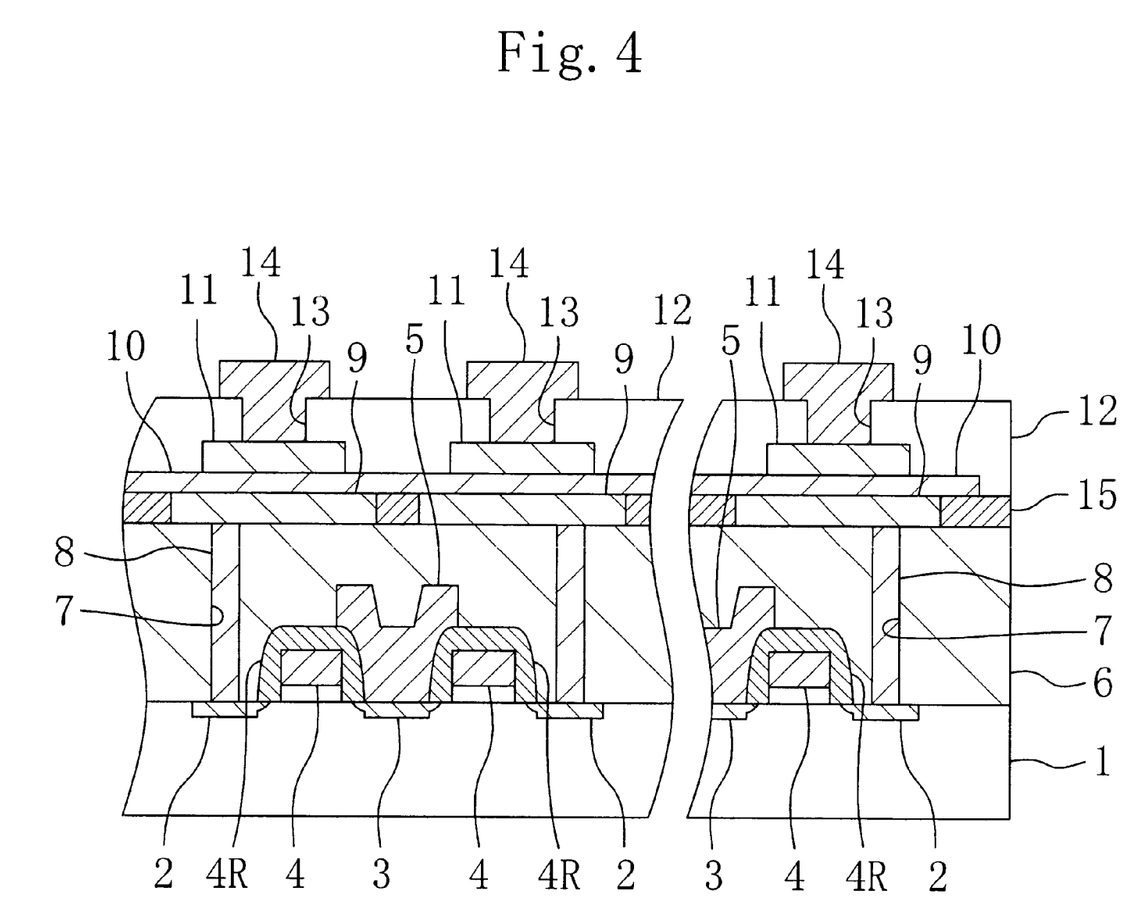
FIG. 4 is a sectional view of a main part of a semiconductor memory according to Embodiment 2 of the invention.

In Embodiment 2 of FIG. 4, like reference numerals are used to refer to like elements used in Embodiment 1 of FIG. 1, and the description is omitted.

As a characteristic of the semiconductor memory of Embodiment 2, an insulating film 15 having the same thickness as a lower electrode 9 is formed between the adjacent lower electrodes 9.

In the semiconductor memory of Embodiment 2, since the upper surface of the lower electrode 9 and the upper surface of the insulating film 15 are disposed on the same plane, a flat capacitor dielectric film 10 can be formed by a simple film forming method such as a spin-on method without using a complicated method such as CVD. Thus, the electric characteristic of the capacitor can be improved.

Modification of Embodiment 2

Figure 5:
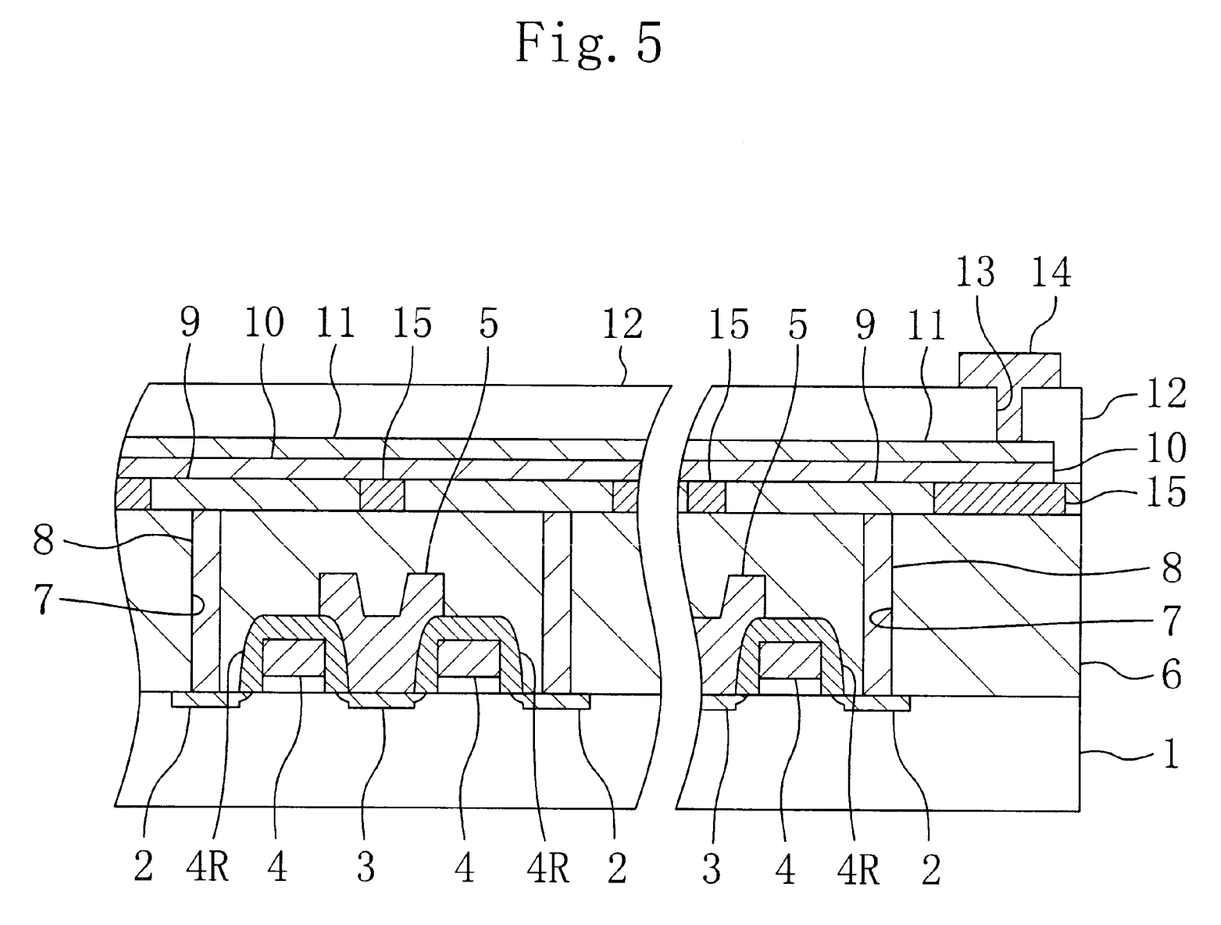
FIG. 5 is a sectional view of a main part of a semiconductor memory according to a modification of Embodiment 2.

A semiconductor memory according to a modification of Embodiment 2 will now be described with reference to FIG. 5. In the modification of FIG. 5, like reference numerals are used to refer to like elements used in Embodiment 1 of FIG. 1, and the description is omitted.

As a characteristic of the semiconductor memory according to the modification of Embodiment 2, as is shown in FIG. 5, an upper electrode 11 is formed over an entire capacitor dielectric film 10, and one contact hole 13 and one metal wire 14 are formed.

What is claimed is:

1. A semiconductor memory comprising plural capacitors which are disposed in the form of an array, wherein each of the plural capacitors comprise:

a lower electrode disposed over a semiconductor substrate;

a capacitor dielectric film comprising an insulating metal oxide formed on the lower electrode; and an upper electrode formed over the upper surface of the capacitor dielectric film, wherein plural insulating films fill in spaces between adjacent lower electrodes, among a plural lower electrodes that compose the plural capacitors over the semiconductor substrate, each insulating film having a sidewall that abuts a sidewall of a respective lower electrode, wherein each of the plural insulating films and each of the lower electrodes have the same thickness, wherein the upper surface of the plural lower electrodes and the upper surface of the plural insulating films are disposed on the same plane, wherein the capacitor dielectric film has a flat surface and is continuously formed over the plural lower electrodes and the plural insulating films, and wherein an outer edge of the capacitor dielectric film which composes an outermost capacitor among the plural capacitors is positioned on an outermost insulating film among the plural insulating films.

2. The semiconductor memory of claim 1, wherein within the outermost capacitor, the outer edge of the capacitor dielectric film is positioned in an outside portion away, by 1 µm or more, from the outer edge of the lower electrode which forms the outermost capacitor.

3. The semiconductor memory of claim 1, wherein the semiconductor memory further comprises plural transistors formed on the semiconductor substrate, the upper electrode is formed of one continuous film extending in a lateral direction along a surface of the semiconductor substrate, and the plural lower electrodes are connected with the plural transistors, respectively.

4. The semiconductor memory of claim 1, wherein within the outermost capacitor, an outer end portion of the upper electrode is positioned on the semiconductor substrate, a contact hole being formed on the outer end portion of the upper electrode.

5. The semiconductor memory of claim 1, wherein within the outermost capacitor, an outer edge of the upper electrode is positioned in an outside portion away from the outer edge of the capacitor dielectric film.

6. The semiconductor memory of claim 1, wherein the capacitor dielectric film is in contact with the plural lower electrodes and the insulating film.

* * * * *

UNITED STATES PATENT AND TRADEMARK OFFICE
CERTIFICATE OF CORRECTION

PATENT NO. : 6,448,598 B2
DATED : September 10, 2002
INVENTOR(S) : Yoshihisa Nagano et al.

It is certified that error appears in the above-identified patent and that said Letters Patent is hereby corrected as shown below:

<u>Title page,</u>
Item [73], Assignee, delete "Matsushita Electronics Corporation" and add
-- Matsushita Electric Industrial Co., Ltd. --

Signed and Sealed this

Eighth Day of June, 2004

JON W. DUDAS
*Acting Director of the United States Patent and Trademark Office*